(12) United States Patent
Higuchi

(10) Patent No.: US 8,652,643 B2
(45) Date of Patent: Feb. 18, 2014

(54) THIN PLATE GLASS LAMINATE AND PROCESS FOR PRODUCING DISPLAY DEVICE USING THIN PLATE GLASS LAMINATE

(75) Inventor: Toshihiko Higuchi, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 646 days.

(21) Appl. No.: 12/028,943

(22) Filed: Feb. 11, 2008

(65) Prior Publication Data

US 2008/0135175 A1 Jun. 12, 2008

Related U.S. Application Data

(63) Continuation of application No. PCT/JP2006/314525, filed on Jul. 21, 2006.

(30) Foreign Application Priority Data

Aug. 9, 2005 (JP) .................................. 2005-230434

(51) Int. Cl.
*B32B 7/06* (2006.01)
*B32B 17/06* (2006.01)

(52) U.S. Cl.
USPC ........... 428/447; 156/718; 156/763; 156/924; 156/99

(58) Field of Classification Search
None
See application file for complete search history.

(56) References Cited

U.S. PATENT DOCUMENTS

| 4,770,942 | A | * | 9/1988 | Itoh et al. .................. 428/447 |
| 5,768,995 | A | | 6/1998 | Miyaguchi et al. |
| 6,107,434 | A | * | 8/2000 | Lewis ........................ 528/15 |
| 2003/0230969 | A1 | * | 12/2003 | Mizuno et al. ................ 313/495 |
| 2006/0127610 | A1 | * | 6/2006 | Kobayashi et al. ........ 428/32.81 |

FOREIGN PATENT DOCUMENTS

| DE | 195 08 502 A1 | | 1/1996 |
| DE | 202 15 401 U1 | | 3/2004 |
| EP | 0238033 | * | 9/1987 |
| JP | 58-54316 | | 3/1983 |
| JP | 6-8145 | | 1/1994 |
| JP | 8-86993 | | 4/1996 |
| JP | 9-105896 | | 4/1997 |
| JP | 9-174778 | | 7/1997 |
| JP | 2000-241804 | | 9/2000 |

(Continued)

OTHER PUBLICATIONS

DE20215401U1, Mar. 3, 2004 (machine translation).*

(Continued)

*Primary Examiner* — Callie Shosho
*Assistant Examiner* — Kenneth Stachel
(74) *Attorney, Agent, or Firm* — Oblon, Spivak, McClelland, Maier & Neustadt, L.L.P.

(57) ABSTRACT

Provided a thin plate glass laminate of a thin plate glass substrate and a support glass substrate, which suppresses inclusion of bubbles and occurrence of convex defects due to foreign matters, from which the thin plate glass substrate and the support glass substrate are easily separated, and which is excellent in heat resistance. A process for producing a display device using the thin plate glass laminate, and a silicone for release paper for the thin plate glass laminate are also provided. A thin plate glass laminate is formed by laminating a thin plate glass substrate and a support glass substrate using a silicone resin layer having releasability and non-adhesive properties.

8 Claims, 1 Drawing Sheet

(56) References Cited

FOREIGN PATENT DOCUMENTS

| | | |
|---|---|---|
| JP | 2000-250000 | 9/2000 |
| JP | 2000-252342 | 9/2000 |
| JP | 2002-36352 | 2/2002 |
| JP | 2003-216068 | 7/2003 |
| JP | 2003-316281 | 11/2003 |
| JP | 2004-26950 | 1/2004 |
| JP | 2004-71158 | 3/2004 |
| JP | 2004-186201 | 7/2004 |
| TW | 561278 | 11/2003 |
| TW | 200508698 A | 3/2005 |

OTHER PUBLICATIONS

JP 2004-26950A, Jan. 29, 2004 (machine translation).*
JP9-174778A, Aug. 7, 1997 (machine translation).*
Handbook of Plastics, Elastomers, and Composites, C.A. Harper pp. i and ii and 397, 401-403, McGraw-Hill 2002.*
U.S. Appl. No. 13/187,631, filed Jul. 21, 2011, Higuchi.
Office Action issed Mar. 27, 2012 in Japanese Application No. 2007-529473 (w/English translation).
Combined Office Action and Search Report issued Feb. 25, 2013 in Taiwanese Patent Application No. 095127817 with English translation of categories of cited documents.

* cited by examiner

THIN PLATE GLASS LAMINATE AND PROCESS FOR PRODUCING DISPLAY DEVICE USING THIN PLATE GLASS LAMINATE

This application is a Continuation of PCT International Application No. PCT/JP2006/314525 filed on Jul. 21, 2006.

TECHNICAL FIELD

The present invention relates to a laminate of a glass substrate to be used for a display device such as a liquid crystal display or an organic EL display, more specifically, a thin plate glass substrate to be used for production of a display device using the thin plate glass substrate, with a support glass substrate, and a process for producing a display device using it, and a silicone for release paper for such a thin plate glass laminate.

BACKGROUND ART

In the field of liquid crystal display devices (LCD), organic EL display devices (OLED), particularly portable display devices such as mobile or portable phones, weight saving and reduction in thickness of display devices have been important objects.

To accomplish the above objects, it has been studied to make a glass substrate to be used for display devices thinner, but if the glass substrate is made thin, a decrease in strength becomes problematic, and the amount of deformation tends to be significant, and accordingly such is not applicable to the existing production line.

Accordingly, a process has been proposed to produce a display device in such a manner that in order to reinforce strength of a glass substrate having a small plate thickness (hereinafter referred to as a "thin plate glass substrate") and to secure a plate thickness applicable to the existing production line, predetermined treatment is applied to produce a display device in a state of a laminate (thin plate glass laminate) obtained by bonding the thin plate glass substrate to another support glass substrate, and after completion of the treatment, the thin plate glass substrate and the support glass substrate are separated (Patent Documents 1 to 6).

In such a process for producing a display device, as a method of laminating and fixing the thin plate glass substrate and the support glass substrate, a method of fixing them by means of electrostatic adsorptivity or vacuum adsorptivity caused between the glass substrates (e.g. Patent Document 1), a method of fixing both ends of the glass substrates by means of glass frit (e.g. Patent Document 2), a method of fusing the two glass substrates by irradiating a portion in the vicinity of the edge surfaces of peripheral portions with laser beams (e.g. Patent Document 3), and a method of disposing a removable adhesive or adhesive sheet over the entire surfaces of the glass substrates, and fixing them by the adhesive force (e.g. Patent Documents 4 to 6) have been proposed.

These methods have latent problems which may adversely affect a display device to be produced.

That is, by the method of fixing the glass substrates by means of electrostatic adsorptivity or vacuum adsorptivity, the method of fixing both ends of the glass substrates by means of glass frit, or the method of fusing the two glass substrates by irradiating a portion in the vicinity of edge surfaces of peripheral portions with laser beams, it is difficult to avoid inclusion of bubbles or convex defects due to foreign matters such as dust in the process of laminating and closely bonding the glass substrates without any interlayer, and accordingly it is difficult to obtain a glass substrate laminate having smooth surface.

In the case of the method of disposing a removable adhesive or adhesive sheet over the entire surface of the glass substrates, it is easy to avoid inclusion of bubbles as compared with the case of directly laminating the glass substrates, and it is considered that convex defects due to foreign matters are less likely to occur. However, it is difficult to separate the thin plate glass substrate and the support glass substrate, and the thin plate glass substrate may be broken at the time of separation. Further, remaining of the adhesive on the thin plate glass substrate after the separation is also problematic. Further, the display device production process comprises a step which requires treatment at high temperature, such as a step of firing an insulating film or an alignment film in a process for producing a liquid crystal display device. Therefore, heat resistance for a display device is required for the adhesive or adhesive sheet, but a method which satisfies both heat resistance and removability has not been proposed yet.

Patent Document 1: JP-A-2000-241804
Patent Document 2: JP-A-58-54316
Patent Document 3: JP-A-2003-216068
Patent Document 4: JP-A-8-86993
Patent Document 5: JP-A-9-105896
Patent Document 6: JP-A-2000-252342

DISCLOSURE OF THE INVENTION

Object to be Accomplished by the Invention

To solve the above-described problems, the object of the present invention is to provide a thin plate glass laminate of a thin plate glass substrate and a support glass substrate, which suppresses inclusion of bubbles and occurrence of convex defects due to foreign matters, from which the thin plate glass substrate and the support glass substrate are easily separated, and which is excellent in heat resistance, a process for producing a display device using such a thin plate glass laminate, and a silicone for release paper for such a thin plate glass laminate.

Means to Accomplish the Object

To accomplish the above object, the present invention provides a thin plate glass laminate formed by laminating a thin plate glass substrate and a support glass substrate, wherein the thin plate glass substrate and the support glass substrate are laminated by means of a silicone resin layer having releasability and non-adhesive properties.

The silicone resin layer having releasability and non-adhesive properties preferably further has low silicone migration properties.

Further, the silicone resin layer having releasability and the non-adhesive properties is preferably a layer made of a cured product of a silicone for release paper.

The cured product of a silicone for release paper is preferably a crosslinked product of a linear polyorganosiloxane having vinyl groups at both ends and/or in its side chains, and a methyl hydrogen polysiloxane having hydrosilyl groups in its molecule.

Hereinbelow, in the present specification, a thin plate glass laminate having a thin plate glass substrate and a support glass substrate laminated by means of a silicone resin layer having releasability and non-adhesive properties will be referred to as a "thin plate glass laminate of the present invention".

In the thin plate glass laminate of the present invention, it is preferred that the thickness of the thin plate glass substrate is less than 0.3 mm, and that the total thickness of the support glass substrate and the silicone resin layer having releasability and non-adhesive properties is at least 0.5 mm.

In the thin plate glass laminate of the present invention, it is preferred that the difference between the coefficient of linear expansion of the support glass substrate and the coefficient of linear expansion of the thin plate glass substrate is at most $15 \times 10^{-7}/°C$.

The present invention further provides a process for producing a display device using a thin plate glass laminate, which comprises a step of forming a silicone resin layer having releasability and non-adhesive properties on a support glass substrate, a step of laminating a thin plate glass substrate on the silicone resin layer-formed surface of the support glass substrate, a step of applying predetermined treatment to produce a display device on the thin plate glass substrate, and a step of separating the treated thin plate glass substrate and the support glass substrate (hereinafter referred to as a "process for producing a display device of the present invention").

In the process for producing a display device of the present invention, the silicone resin layer having releasability and non-adhesive properties is preferably a layer made of a cured product of a silicone for release paper.

The cured product of a silicone for release paper is preferably a crosslinked product of a linear polyorganosiloxane having vinyl groups at both ends and/or in its side chains, and a methyl hydrogen polysiloxane having hydrosilyl groups in its molecule.

In the process for producing a display device of the present invention, the step of forming a silicone resin layer having releasability and non-adhesive properties or the support glass substrate preferably includes applying the silicone for release paper on the support glass substrate and curing the silicone for release paper.

The silicone for release paper preferably contains substantially no non-reactive silicone.

The silicone for release paper preferably contains a linear polyorganosiloxane having vinyl groups at both ends and/or in its side chains, a methyl hydrogen polysiloxane having hydrosilyl groups in its molecule, and a platinum catalyst.

Application of the silicone for release paper is preferably carried out by a die coating method, a spin coating method or a screen printing method.

The silicone for release paper is preferably heat-cured at a temperature of from 50 to 250° C.

The step of laminating a thin plate glass substrate on the silicone resin layer-formed surface of the support glass substrate is preferably carried out by vacuum pressing or vacuum lamination.

Still further, the present invention provides a silicone for release paper for a thin plate glass laminate to be used for lamination of a thin plate glass substrate and a support glass substrate.

Effects of the Invention

The thin plate glass laminate of the present invention has such advantages that since a thin plate glass substrate and a support glass substrate are laminated by means of a flexible silicone resin layer, bubbles are less likely to be included at the time of lamination, and even if bubbles are included, the bubbles can easily be removed by pressure bonding by means of rolls or pressing. Particularly when lamination of the thin plate glass substrate and the support glass substrate is carried out by a vacuum lamination method or a vacuum pressing method, inclusion of bubbles is suppressed, and adhesion properties are favorable. Further, when lamination of the thin plate glass substrate and the support glass substrate is carried out by a vacuum lamination method or a vacuum pressing method, even if very small bubbles remain, the bubbles will not grow by heating, whereby convex defects are less likely to occur in the thin plate glass substrate.

Further, it also has such an advantage that even when foreign matters such as dust are included in the interface of the laminate, the flexible silicone resin layer will deform, whereby convex defects are less likely to occur in the thin plate glass laminate.

Further, since the layer interposed between the thin plate glass substrate and the support glass substrate is a silicone resin layer excellent in heat resistance, the laminate is excellent in heat resistance.

In the thin plate glass laminate of the present invention, since the thin plate glass substrate and the support glass substrate are laminated by means of a silicone resin layer having releasability and non-adhesive properties, the thin plate glass substrate and the support glass substrate can easily be separated, whereby the thin plate glass substrate will not be broken when the glass substrates are separated. Such properties are obtained even after the thin plate glass laminate is heated in the air at a temperature of 300° C. for one hour, and such is suitable for use in the process for producing a display device involving heat treatment.

Further, when the silicone resin layer has low silicone migration properties, components in the silicone resin layer will less likely to migrate to the thin plate glass substrate when the glass substrates are separated. Accordingly, after the separation, the support glass substrate on which the silicone resin layer is formed can be repeatedly used for lamination with another thin plate glass substrate. Further, since components in the silicone resin layer are less likely to migrate to the surface of the thin plate glass substrate after separation, bonding failure or the like is less likely to occur when a polarizing plate or the like is bonded to the surface of the thin plate glass substrate.

By the process for producing a display device of the present invention, by use of the thin plate glass laminate of the present invention, deformation of the thin plate glass substrate and breakage of the thin plate glass substrate during production can be prevented, whereby the yield of a display device to be produced can be improved.

In a case where in the process for producing a display device of the present invention, the step of laminating a thin plate glass substrate on the silicone resin layer-formed surface of the support glass substrate is carried out by vacuum pressing or vacuum lamination, inclusion of bubbles in the silicone resin layer can be suppressed. As a result, in a step of forming a transparent electrode such as ITO in vacuum, occurrence of defects originating from the bubbles included in the silicone resin layer can be suppressed.

MEANINGS OF SYMBOLS

1, 40: Support glass substrate
2, 50: Thin plate glass substrate 3, 60: Resin layer
10, A: Thin plate glass laminate
20, 25, 30: Polycarbonate

BEST MODE FOR CARRYING OUT THE INVENTION

Now, the thin plate glass laminate of the present invention will be described.

Figure 1:
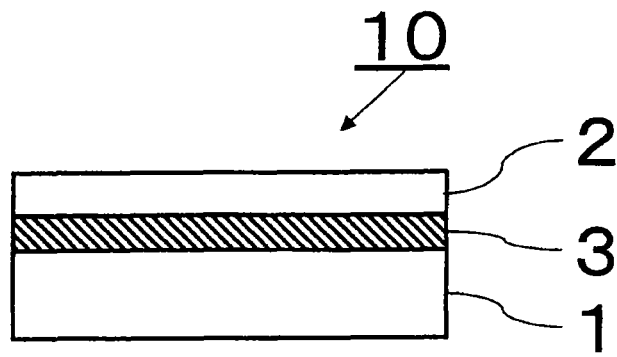
FIG. 1 is a cross section schematically illustrating a thin plate glass laminate of the present invention.

The thin plate glass laminate 10 of the present invention has a structure having a silicone resin layer 3 between a support glass substrate 1 and a thin plate glass substrate 2, as shown in FIG. 1.

The thin plate glass substrate is a glass substrate for a display device such as a LCD or an OLED, and has a thickness less than 0.3 mm. The thickness of the thin plate glass substrate is preferably at most 0.2 mm, more preferably at most 0.1 mm. Further, the thickness of the thin plate glass substrate is preferably at least 0.05 mm.

Here, a display device to which the present invention is to be applied is mainly a small display device to be used for a mobile terminal such as a mobile phone or a PDA. The display device is mainly an LCD or an OLED, and the LCD includes TN, STN, FE, TFT and MIM types.

The properties required for a thin plate glass substrate such as the heat shrinkage ratio, the surface shape and the chemical resistance vary depending upon the type of the display device. Therefore, the thin plate glass substrate may be made of alkali glass. However, the thin plate glass substrate is preferably made of alkali-free glass, which has a low heat shrinkage ratio.

In the present invention, the thin plate glass substrate is preferably one having a low heat shrinkage ratio. In the case of glass, as the index of thermal expansion and heat shrinkage, the coefficient of linear expansion as defined in JIS R3102 (1995) is employed. The thin plate glass substrate preferably has a coefficient of linear expansion of at most $50\times10^{-7}/°$ C., more preferably at most $45\times10^{-7}/°$ C., furthermore preferably at most $40\times10^{-7}/°$ C., still furthermore preferably at most $30\times10^{-7}/°$ C., most preferably at most $20\times10^{-7}/°$ C.

The support glass substrate is required to be thicker than the thin plate glass substrate, since it is to be laminated on the thin plate glass substrate for the purpose of reinforcing strength of the thin plate glass substrate. The thickness of the support glass substrate is preferably such that the laminate with the thin plate glass substrate can be carried on the existing production line. For example, in a case where the existing production line is designed to carry substrates having a thickness of 0.5 mm and the thickness of the thin plate glass substrate is 0.1 mm, the thickness of the support glass substrate is preferably such that the total thickness of the support glass substrate and the silicone resin layer having releasability and non-adhesive properties is 0.4 mm. Further, as described above, the thickness of the thin plate glass substrate is preferably at most 0.2 mm. The existing production line is most commonly designed to carry glass substrates having a thickness of 0.7 mm. Accordingly, the total thickness of the support glass substrate and the silicone resin layer having releasability and non-adhesive properties is preferably at least 0.5 mm. However, the production line is not limited to one designed to carry glass substrates having a thickness of 0.5 mm or 0.7 mm, and it is designed to carry glass substrates having another thickness in some cases. For example, it may be designed to carry glass substrates having a thickness less than 0.5 mm in some cases, or may be designed to carry glass substrates having a thickness exceeding 0.7 mm in other cases.

Considering the thickness of the after-mentioned silicone resin layer having releasability and non-adhesive properties, the thickness of the support glass substrate is preferably from 0.3 to 0.8 mm. Further, the total thickness of the support glass substrate and the silicone resin layer having releasability and non-adhesive properties is preferably at least 0.5 mm and preferably at most 1.0 mm.

Further, the support glass substrate is to reinforce the strength of the thin plate glass substrate, and adoringly its material is not particularly limited, and it may be either alkali glass or alkali-free glass. However, the support glass substrate preferably has a coefficient of linear expansion substantially equal to the coefficient of linear expansion of the thin plate glass substrate. If the coefficient of linear expansion of the support glass substrate is higher than the coefficient of linear expansion of the thin plate glass substrate, expansion of the support glass substrate is suppressed by the thin plate glass laminate in a heating step in the process for producing a display device, whereby the thin plate glass laminate will be warped, and on the contrary if the coefficient of linear expansion of the support glass substrate is lower than the coefficient of linear expansion of the thin plate glass substrate, the thin plate glass substrate will be separated from the silicone resin layer due to expansion of the thin plate glass substrate.

In the present invention, the coefficients of linear expansion being substantially equal does not mean the coefficient of linear expansion of the thin plate glass substrate completely agrees with the coefficient of linear expansion of the support glass substrate, but they may differ to a small extent. The difference in the coefficient of linear expansion between the thin plate glass substrate and the support glass substrate is preferably at most $35\times10^{-7}/°$ C., more preferably at most $25\times10^{-7}/°$ C.×, furthermore preferably at most $15\times10^{-7}/°$ C.

The support glass substrate is to reinforce the thin plate glass substrate and becomes a base to hold the thin plate glass substrate when the thin plate glass laminate moves on the production line. Accordingly, its size is preferably equal to or larger than the thin plate glass substrate.

In production of the thin plate glass laminate of the present invention, the silicone resin layer having releasability and non-adhesive properties is formed on the support glass substrate, and then the thin plate glass substrate is laminated on the silicone resin layer-formed surface of the support glass substrate.

The silicone resin layer having releasability and non-adhesive properties is a silicone resin layer having proper flexibility, and means one which fixes the thin plate glass substrate by force resulting from Van der Waals force among facing solid molecules very close to one another, i.e. bond strength, not one which fixes the thin plate glass substrate by adhesive force such as an adhesive. Specific embodiments of the silicone resin layer having releasability and non-adhesive properties will be described hereinafter.

Since the silicone resin layer having releasability and non-adhesive properties fixes the thin plate glass substrate by bond strength, it has a high value of force to displace the thin plate glass substrate and the support glass substrate in parallel with the interface of the laminate, i.e. shear fore. Accordingly, the thin plate glass substrate will not slip from the support glass substrate during production of a display device. Accordingly, the substrates will not be separated due to slippage. As the shear force, the load when the support glass substrate is separated without breakage of the glass substrate in the after-mentioned shear strength test is preferably at least 0.1 kgf/ cm², particularly preferably at least 0.5 kgf/cm², furthermore preferably at least 1 kgf/cm², in that the thin plate glass substrate will not slip from the support glass substrate during production of a display device.

On the other hand, due to releasability and non-adhesive properties which the silicone resin layer has, the force to separate the thin plate glass substrate from the support glass substrate in a vertical direction, i.e. peel force is very low. Accordingly, it is possible to easily separate the support glass substrate from the thin plate glass substrate after predetermined treatment is applied to produce a display device on the thin plate glass substrate.

As the peel force, the load under which the support glass substrate is peeled without breakage of the glass substrate in the after-mentioned peel test (1) is preferably at most 2 kgf/cm², particularly preferably at most 1.5 kgf/cm², furthermore preferably at most 1 kgf/cm², especially preferably at most 0.5 kgf/cm², in that the support glass substrate can easily be separated from the thin plate glass substrate. In a case where a flexible substrate with which roll-to-roll is possible, such as a resin plate, is used as a support substrate, the peel force should be evaluated by an angled peel test such as 90° peel test or 180° peel test. However, in the peel test of glass substrates having rigidity to a certain extent, it is necessary to evaluate the peel force by a test method such as peel test (1) (so-called 0° peel test). Accordingly, also in the case of evaluating the peel force, the peel force is preferably within the above range in the test method such as peel test (1).

The silicone resin layer is excellent in heat resistance and accordingly even after it is subjected to heat treatment, for example, it is heated in the air at a temperature of 300° C. for one hour, it exhibits the above properties of high shear force and very low peel force. Hereinafter in the present specification, the silicone resin layer subjected to heat treatment, for example heated in the air at a temperature of 300° C. for one hour having the above properties i.e. having high shear force and having very low peel force, will be referred to as "being excellent in releasability after heat treatment.

Since the silicone resin layer having releasability and non-adhesive properties has proper flexibility, bubbles are less likely to be included at the time of lamination, and even if bubbles are included, the bubbles can easily be removed by pressure bonding by means of rolls, pressing or the like. Further, even when foreign matters such as dust are included in the interface of the laminate, convex defects of the thin plate glass laminate are less likely to form since the flexible resin layer deforms.

The silicone resin layer having releasability and non-adhesive properties is preferably a cured product of a silicone for release paper. The silicone for release paper comprises, as the chief agent, a silicone containing a linear dimethyl polysiloxane in its molecule which is particularly excellent in release properties among silicones. The silicone for release paper contains the above chief agent and a crosslinking agent, and is fixed on the surface of the substrate by curing by means of a catalyst, a photopolymerization initiator or the like. The cured product (cured coating film) of the silicone for release paper has excellent release properties and appropriate flexibility.

Further, the surface energy of the silicone resin layer having releasability and non-adhesive properties is preferably from 16 to 21 erg/cm² from such reasons that bubbles included at the time of lamination are easily removed, and the support glass substrate can easily be separated from the thin plate glass substrate.

When the silicone for release paper having such properties is used as the silicone resin layer, a silicone resin layer having appropriate flexibility and having releasability and non-adhesive properties can be obtained. Whether the resin layer contains the silicone for release paper or not can be estimated to a certain extent from IR (infrared spectroscopy) or the strength or the adhesive properties of the resin layer.

The silicone for release paper can be classified by the curing mechanism into a condensation reaction silicone, an addition reaction silicone, an ultraviolet-curable silicone and an electron beam-curable silicone. Any of these can be used in the present invention. However, most preferred is an addition reaction silicone from such a viewpoint that the curing reaction is easily carried out, a silicone resin layer having releasability and non-adhesive properties is easily formed when the cured coating film is formed, and the cured product is excellent in heat resistance.

The addition reaction silicone comprises a chief agent comprising a linear polyorganosiloxane having vinyl groups at both ends and/or in its side chains, and a crosslinking agent comprising a methyl hydrogen polysiloxane having hydrosilyl groups in its molecule, and is to be subjected to heat curing reaction in the presence of a platinum catalyst.

The linear polyorganosiloxane having vinyl groups at both ends and/or in its side chains is a compound represented by the following formula 1 or 2. In the formula 1, each of m and n is an integer and may be 0. In a case where m is 0, it is a linear polyorganosiloxane having vinyl groups at both ends. When m is an integer of at least 1, it is a linear polyorganosiloxane having vinyl groups at both ends and in its side chains. Further, in the formula 2, m is an integer of at least 2, and n is an integer and may be 0. In such a case, it is a linear polyorganosiloxane having vinyl groups in its side chains.

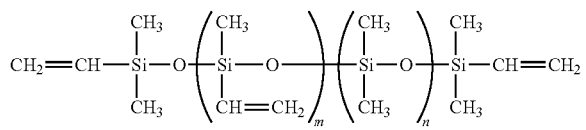

Formula 1

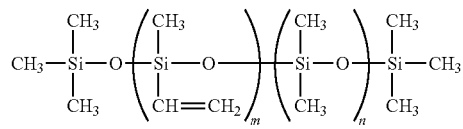

Formula 2

The methyl hydrogen polysiloxane having hydrosilyl groups in its molecule is a compound represented by the following formula, and in the formula, a is an integer, and b is an integer of at least 1.

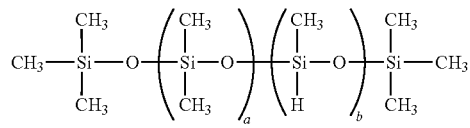

Some of terminal methyl groups in the methyl hydrogen polysiloxane may be a hydrogen atom or a hydroxyl group.

The mixing ratio of the chief agent comprising the linear polyorganosiloxane having vinyl groups at both ends and/or in its side chains to the crosslinking agent comprising the methyl hydrogen polysiloxane having hydrosilyl groups in its molecule is preferably adjusted so that the molar ratio of the hydrosilyl groups to the vinyl groups is from 1.3/1 to 0.7/1, particularly preferably from 1.2/1 to 0.8/1.

In a case where the molar ratio of the hydrosilyl groups to the vinyl groups exceeds 1.3/1, the peel force after heat treatment may increase, whereby the releasability may not be sufficient. Particularly in a case of producing an LCD or the like, the support glass substrate is peeled after heat treatment in many cases, and the releasability after heat treatment is a significant problem. Further, in a case where the molar ratio of the hydrosilyl groups to the vinyl groups is less than 0.7/1, the crosslinking density of the cured product tends to decrease, whereby chemical resistance or the like may be poor. The reason why the peel force after heat treatment increases if the molar ratio of the hydrosilyl groups to the vinyl groups exceeds 1.3/1 is unclear, but is considered that a certain reaction of unreacted hydrosilyl groups in the cured product and silanol groups on the glass surface by heat treatment is related.

The catalyst to be used for heat curing reaction is preferably a platinum catalyst, and as the platinum catalyst, known one may be used. Specifically, it may, for example, be chloroplatinic acid such as tetrachloroplatinic (II) acid or hexachloroplatinic (IV) acid, an alcohol compound of chloroplatinic acid, an aldehyde compound or a complex salt of chloroplatinic acid with an olefin.

The amount of the platinum catalyst used is preferably from 0.1 to 20 parts by mass, more preferably from 1 to 10 parts by mass per 100 parts by mass of the silicone for release paper.

The silicone for release paper may be a solvent, emulsion or solventless form, and any form can be used. However, in view of productivity, safety and environmental properties, the solventless form is preferred. In the case of using the solventless form, bubbles are less likely to remain in the resin layer since a solvent which causes bubbles at the time of heat curing, ultraviolet curing or electron beam curing is not contained.

The silicone resin layer having releasability and non-adhesive properties may be formed only by one silicone for release paper or may be formed by two or more silicones for release paper. In a case where it is formed by two or more silicones for release paper, it may be a silicone resin layer having a multilayer structure in which the two or more silicones for release paper are laminated with each other, or may be a mixed silicone resin layer containing the two or more silicones for release paper in one layer.

The silicone resin layer having releasability and non-adhesive properties is preferably such that components in the silicone resin layer are less likely to migrate to the thin plate glass substrate when the glass substrates are separated, that is, it preferably has low silicone migration properties.

The degree of easiness of migration of components in the silicone resin layer can be judged employing the residual adhesion ratio of the silicone resin layer as an index. The residual adhesion ratio of the silicone resin layer can be measured by the following method.

(Method for Measuring Residual Adhesion Ratio)

A standard adhesive tape (CELLOTAPE CT405A-15 (manufactured by NICHIBAN Co., Ltd.)) with a width of 15 mm is bonded to the surface of the silicone resin layer manually and heated at 70° C. for 20 hours in the air. After a lapse of 20 hours, the standard adhesive tape is peeled from the silicone resin layer. The peeled standard adhesive tape is bonded to the surface of a clean glass substrate (e.g. AN100 (manufactured by Asahi Glass Company, Limited)), and then the 180° peel strength (300 mm/min) is measured (peel strength (A)).

The same standard adhesive tape as above is bonded to the surface of a clean glass substrate (e.g. AN100) manually and then left at room temperature in the air for 20 hours. After a lapse of 20 hours, the standard adhesive tape is peeled from the surface of the glass substrate. The peeled standard adhesive tape is bonded to the surface of a glass substrate (e.g. AN100), and the 180° peel strength (300 mm/min) is measured (peel strength (B)).

The residual adhesion ratio is determined from the following formula:

Residual adhesion ratio (%)=peel strength $(A)$/peel strength $(B)\times 100$

The silicone resin layer having releasability and non-adhesive properties preferably has a residual adhesion ratio obtained by the above measuring method of at least 95%, more preferably at least 98%. When the residual adhesion ratio is at least 95%, it is considered that migration of components in the resin layer from the silicone resin layer to the thin plate glass substrate surface is very low. Therefore, after the glass substrates are separated, the support glass substrate on which the silicone resin layer is formed can be repeatedly used for lamination with another thin plate glass substrate. Further, since components in the silicone resin layer are less likely to migrate to the surface of the thin plate glass substrate after separation, bonding failure or the like is less likely occur when a polarizing plate or the like is bonded to the surface of the thin plate glass substrate.

To obtain a silicone resin layer having low silicone migration properties, a silicone for release paper containing no components having high migration properties should be used. As a common method, a non-reactive silicone is blended in some cases so that the silicone for release paper has releasability. In such a case, as the non-reactive silicone, a linear dimethylpolysiloxane having a very high molecular weight or a relatively low molecular weight linear dimethylpolysiloxane having compatibility with the cured coating film lowered by introducing a phenyl group or a higher alkyl group, is used. Since such a non-reactive silicone is a component having high migration properties, the silicone for release paper used in the present invention preferably has a non-reactive silicone content of at most 5 mass %, and it more preferably contains substantially no non-reactive silicone.

In the present invention, a suitable silicone for release paper may, for example, be specifically KNS-320A, KS-847 (each manufactured by Shin-etsu Silicones), TPR6700 (manufactured by GE Toshiba Silicone), a combination of a vinyl silicone "8500" (manufactured by Arakawa Chemical Industries, Ltd.) with a methyl hydrogen polysiloxane "12031" (manufactured by Arakawa Chemical Industries, Ltd.), a combination of a vinyl silicone "11364" (manufactured by Arakawa Chemical Industries, Ltd.) with a methyl hydrogen polysiloxane "12031", or a combination of a vinyl silicone "11365" with a methyl hydrogen polysiloxane "12031". KNS-320A, KS-847 and TPR6700 are silicones preliminarily containing a chief agent and a crosslinking agent.

The thickness of the silicone resin layer having releasability and non-adhesive properties is preferably from 1 to 100 μm. If the silicone resin layer is thinner than 1 μm, bond strength between the thin plate glass substrate and the silicone resin layer may be insufficient. Further, in a case where foreign matters are present, they are likely to lead to convex defects of the thin plate glass substrate. On the other hand, if it exceeds 100 μm, such a silicone resin layer is less likely to contribute to properties as the silicone resin layer having releasability and non-adhesive properties, and curing of the silicone resin will take long, such being uneconomical. The thickness of the silicone resin layer is more preferably from 5 to 20 μm. When the thickness of the silicone resin layer is from 5 to 20 μm, favorable bond strength will be obtained over thin plate glass substrates having a wide range of thicknesses.

A method of forming a silicone resin layer having releasability and non-adhesive properties on the support glass substrate is not particularly limited and is properly selected from known methods. In a case where a silicone for release paper is used for the silicone resin layer, the silicone for release paper is applied to the surface of the support glass substrate and the silicone for release paper is cured before the thin plate glass is laminated.

As a method of applying the silicone for release paper, a known method may be used. Specifically, it may, for example, be a spray coating method, a die coating method, a spin coating method, a dip coating method, a roll coating method, a bar coating method, a screen printing method or a gravure coating method. Such a coating method can properly be selected depending upon the type of the silicone for release paper.

For example, in a case where the silicone for release paper is a solventless type, the die coating method, the spin coating method or the screen printing method is suitable.

In a case where the silicone for a release paper is a solventless type, the application amount is preferably from 1 $g/m^2$ to 100 $g/m^2$, more preferably from 5 $g/m^2$ to 20 $g/m^2$.

In the case of an addition reaction silicone, a mixture of the silicone for release paper containing the chief agent and the crosslinking agent with a catalyst is applied to the support glass substrate by any of the above methods, and then heat-cured. The heat-curing conditions vary depending upon the amount of the catalyst blended, and for example, when 2 parts by mass of a platinum catalyst is blended based on 100 parts by mass of the silicone for release paper, the mixture is heat-cured in the air at from 50° C. to 250° C., preferably from 100° C. to 200° C. for from 5 to 60 minutes, preferably from 10 to 30 minutes.

In order to obtain a silicone resin layer having low silicone migration properties, it is preferred that the curing reaction proceeds as far as possible so that unreacted silicone components will not remain in the silicone resin layer. By heat-curing under the above conditions, unreacted silicone components will not remain in the silicone resin layer. If the heating time is too long or the heating temperature is too high as compared with the above conditions, oxidative destruction of the silicone resin will take place simultaneously, and low molecular weight silicone components will form, thus increasing the silicone migration properties.

It is preferred that the curing reaction proceeds as far as possible so that unreacted silicone components will not remain in the silicone resin layer, to obtain favorable releasability after heat treatment also.

After the silicone resin layer having releasability and non-adhesive properties is formed on the support glass substrate, the thin plate glass substrate is laminated on the silicone resin-formed surface of the support glass substrate. In a case where the silicone for release paper is used for the silicone resin layer, the silicone for release paper applied to the support glass substrate is heat-cured to form the silicone resin layer, and then the thin plate glass substrate is laminated on the silicone resin-formed surface of the support glass substrate.

By heat-curing the silicone for release paper, the silicone resin cured product is chemically bonded to the support glass, and the silicone resin layer is bonded to the support glass by an anchor effect. By these actions, the silicone resin layer is fixed to the support glass substrate.

On the other hand, the thin plate glass substrate is fixed to the silicone resin layer by force resulting from Van der Waals force among facing solid molecules very close to one another, i.e. bond strength. Therefore, after the thin plate glass substrate laminated on the silicone resin-formed surface of the support glass substrate is separated, migration of components in the silicone resin layer to the surface of the thin plate glass substrate after separation is prevented. Such an effect is obtained by laminating the thin plate glass substrate after the silicone resin layer is formed on the support glass substrate.

Namely, by use of the silicone for release paper, the support glass substrate and the thin plate glass substrate can be maintained in a state where they are laminated, and in addition, when the thin plate glass substrate is separated, migration of components in the silicone resin layer to the surface of the thin plate glass substrate can be prevented, and consequently, the object of the present invention can be accomplished.

The procedure of laminating the thin plate glass substrate on the silicone resin-formed surface of the support glass substrate can be carried out by a known means. For example, the thin plate glass substrate is laminated on the silicone resin-formed surface in normal pressure environment, and then the laminate is pressure bonded by means of rolls or pressing. By pressure bonding by rolls or pressing, the silicone resin layer and the thin plate glass substrate will more closely be bonded.

Further, by pressure bonding by means of rolls or pressing, bubbles included in the silicone resin layer will easily be removed.

However, with a view to suppressing inclusion of bubbles and securing favorable bonding, it is preferred to employ a vacuum lamination method or a vacuum pressing method. Such an advantage is also obtained that by lamination in a vacuum, bubbles will not grow by heating even if very small bubbles remain, whereby convex defects of the thin plate glass substrate are less likely to form.

When the thin plate glass substrate is laminated on the silicone resin layer-formed surface of the support glass substrate, it is necessary to sufficiently clean the surface of the thin plate glass substrate and to laminate them in an environment with high cleanness.

Extremely small foreign matters will be absorbed in the flexible silicone resin layer by its deformation and will not influence over smoothness of the surface of the thin plate glass substrate after lamination, but depending upon the amount and the size of the foreign matters, they may lead to convex defects on the surface of the thin plate glass substrate after lamination.

Now, the process for producing a display device of the present invention will be described. In the process for producing a display device of the present invention, after the thin plate glass laminate of the present invention is formed by the above procedure, predetermined treatment to produce a display device on the thin plate glass substrate of the laminate is carried out. In this specification, predetermined treatment to produce a display device widely includes various treatments carried out in production process when a display device such as an LCD or an OLED is produced. Specific examples of treatment carried out includes, with reference to production of an LCD as an example, a step of forming an array on the thin plate glass substrate, and a step of forming a color filter on a thin plate glass substrate different from the above thin plate glass substrate, a step of bonding the thin plate glass substrate on which the array is formed and the thin plate glass substrate on which the color filter is formed (an array/color filter bonding step), and as treatment carried out in these steps, specifically, for example, washing with pure water, drying, film deposition, resist coating, exposure, developing, etching and removal of resist may, for example, be mentioned. Further, as a step carried out after the array/color filter bonding step, a liquid crystal injection step and a step of sealing the inlet carried out after the treatment may be mentioned, and treatment included in these steps is also included. However, not all these treatments are required to be carried out in a laminate state. For example, in view of strength and handling efficiency, it is preferred to carry out up to the array/color filter bonding step in a laminate state, to separate the thin plate glass substrate and the support glass substrate and then to carry out the liquid crystal injection treatment.

Here, in the process for producing a display device of the present invention, not both a glass substrate on which an array is to be formed and a glass substrate on which a color filter is to be formed should be a thin plate glass substrate. For example, a thin plate glass substrate on which an array is formed and a glass substrate having an ordinary thickness on which a color filter is formed may be bonded, or a glass substrate having an ordinary thickness on which an array is formed and a thin plate glass substrate on which a color filter is formed may be bonded. In these cases, such an advantage can be obtained that mechanical strength can be improved, although the total thickness of the display device after formed into cells tends to be thick. The glass substrate having an ordinary thickness means a glass substrate having a thickness of at least 0.3 mm.

Further, with reference to production of an OLED as an example, steps of forming an organic EL structure on the thin plate glass substrate includes various steps such as a step of forming a transparent electrode, a step of evaporating a hole injection layer, a hole transport layer, an electroluminescence layer, an electron transport layer, etc., and a sealing step, and as treatment carried out in these steps, specifically, for example, film deposition treatment, evaporation treatment and treatment to bond a sealing plate may be mentioned.

After the above predetermined treatment is carried out, the thin plate glass substrate and the support glass substrate are separated. Separation may be carried out by manual peeling, but it is possible to more easily peel them by making a trigger for peeling at the edge portion by means of a razor or by injecting air to the interface of the laminate. On the peeled support glass substrate, the silicone resin layer having releasability and non-adhesive properties is still formed, and accordingly it can be used for lamination with another thin plate glass substrate again. When the silicone resin layer has low silicone migration properties, the silicone resin layer after separation has a high residual adhesion ratio, and accordingly the support glass substrate on which the silicone resin layer is formed can be repeatedly used for lamination with another thin plate glass substrate.

After the thin plate glass substrate and the support glass substrate are separated, a display device having a thin plate glass substrate can be obtained via required desired steps. The steps carried out include, in the case of an LCD, for example, a separation step into cells having a desired size, a step of injecting liquid crystal and sealing the inlet, a step of bonding a polarizing plate and a module forming step. In the case of an OLED, in addition to these steps, a step of assembling the thin plate glass substrate on which an organic EL structure is formed and an opposing substrate, is included. Here, the separation step into cells having a desired size is carried out preferably by cutting with a laser cutter, whereby strength of the thin plate glass substrate will not decrease by the cutting treatment, and no cullet will form.

Further, the present invention further provides the above described silicone for release paper for the thin plate glass laminate to be used for lamination of the support glass substrate and the thin plate glass substrate.

EXAMPLES

Example 1

A support glass substrate of 400 mm×300 mm×0.7 mm in thickness having a coefficient of linear expansion of $38 \times 10^{-7}/°$ C. (AN100, manufactured by Asahi Glass Company, Limited) was washed with pure water and cleaned by e.g. UV cleaning, and then a mixture comprising 100 parts by mass of a solventless addition reaction silicone for release paper (KNS-320A, manufactured by Shin-etsu Silicones) and 2 parts by mass of a platinum catalyst (CAT-PL-56, manufactured by Shin-etsu Silicones) was applied (application amount: 10 $g/m^2$) to the support glass substrate by a spin coater and heat-cured at 180° C. for 30 minutes in the air to obtain a silicone resin layer having a thickness of 16 µm.

The surface on the side to be in contact with a silicone resin layer of a thin plate glass substrate (AN100) of 400 mm×300 mm×0.1 mm in thickness having a coefficient of linear expansion of $38 \times 10^{-7}/°$ C. was washed with pure water and cleaned by e.g. UV cleaning, and then the silicone resin layer-formed surface of the support glass and the thin plate glass substrate were bonded by vacuum pressing at room temperature to obtain a thin plate glass laminate (thin plate glass laminate A) having a silicone resin layer having releasability and non-adhesive properties of the present invention.

In the thin plate glass laminate A, the thin plate glass substrate was closely bonded to the silicone resin layer without formation of bubbles, was free from convex defects and had favorable smoothness.

The formed thin plate glass laminate A was evaluated as follows.

(1) Simplified Peel Test

The thin plate glass laminate A was disposed so that the thin plate glass substrate faced upward, and the support glass substrate was fixed by means of a jig. In such a state, a part of the peripheral portion of the thin plate glass substrate was peeled from the support glass substrate with a razor, and further, the thin plate glass substrate was manually separated from the support glass substrate, whereupon it was easily peeled.

Further, the thin plate glass laminate A after heat treated at 300° C. for one hour in the air was subjected to the above peel test, whereupon the thin plate glass substrate could be peeled from the support glass substrate without destruction, thus indicating favorable heat resistance.

(2) Peel Test (1) (Before Heating)

Figure 2:
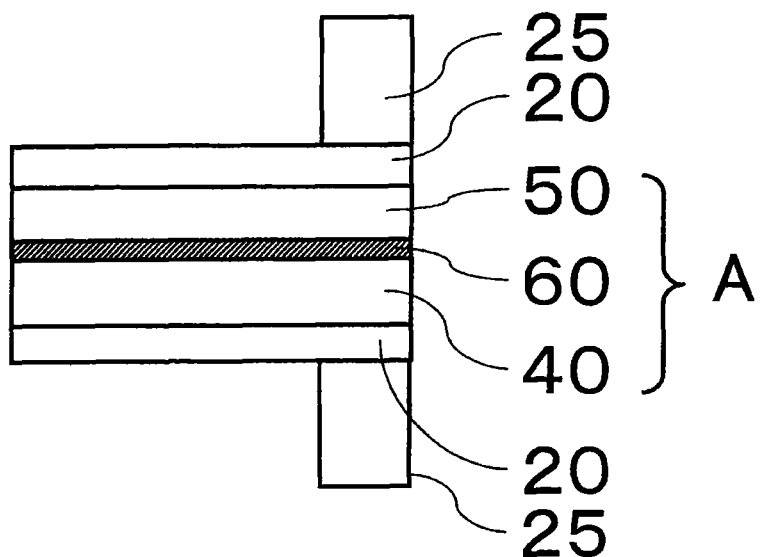
FIG. 2 is a cross section schematically illustrating a thin plate glass laminate to describe peel test (1) of the present invention.

A test was conducted using a jig as shown in FIG. 2.

The thin plate glass laminate A was cut into a size of 50 mm×50 mm, and on the both glass (the support glass substrate 40 and the thin plate glass substrate 50) surfaces of the thin plate glass laminate A, a polycarbonate 20 of 50 mm×50 mm×5 mm in thickness was bonded with an epoxy two-part adhesive for glass. Further, on the surface of both bonded polycarbonates 20, a polycarbonate 25 of 50 mm×50 mm×5 mm in thickness was further bonded vertically. The position on which the polycarbonate 25 was bonded was, as shown in FIG. 2, the farthest point of the polycarbonate 20 in the lengthwise direction and a position in parallel with a side of the polycarbonate 20 in the lateral direction.

The thin plate glass laminate A to which the polycarbonates 20 and 25 were bonded was disposed so that the support glass substrate faced downward. The polycarbonate 25 bonded to the thin plate glass substrate side was fixed with a jig, and the polycarbonate 25 bonded to the support glass substrate side was separated vertically downward at a rate of 300 mm/min, whereupon the support glass substrate was peeled when a load of 13.8 kgf (0.55 kgf/cm$^2$) was applied. No fracture or the like occurred on the support glass substrate and the thin plate glass substrate.

(3) Peel Test (1) (After Heating)

Peel test (1) (after heating) was carried out in the same manner as the peel test (1) (before heating) instead of the thin plate glass laminate A subjected to heat treatment at 300° C. for one hour in the air after lamination was used instead of the thin plate glass laminate A in the peel test (1) (before heating). The support glass substrate was peeled when a load of 45 kgf (1.8 kgf/cm$^2$) was applied. No fracture or the like occurred on the support glass substrate and the thin plate glass substrate.

(4) Shear Strength Test

Figure 3:
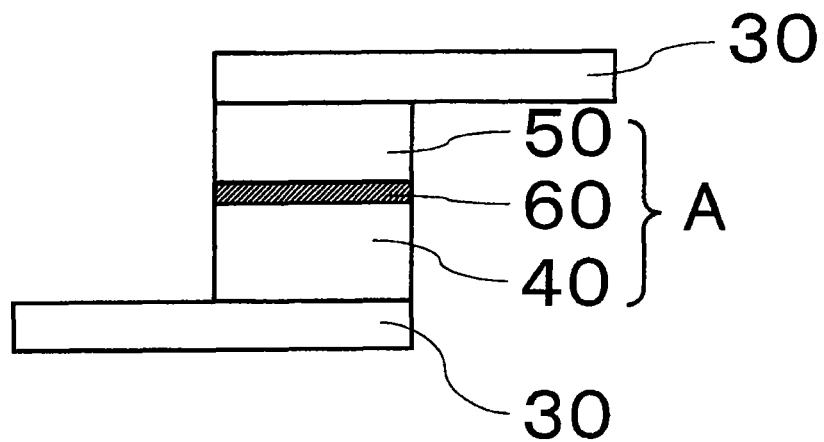
FIG. 3 is a cross section schematically illustrating a thin plate glass laminate to describe the shear strength test of the present invention.

Test was carried out using a jig as shown in FIG. 3.

The thin plate glass laminate A was cut into a size of 25 mm×25 mm, and on the both glass (the support glass substrate 40 and the thin plate glass substrate 50) surfaces of the thin plate glass laminate A, a polycarbonate 30 of 25 mm×50 mm×3 mm in thickness was bonded with an epoxy two-part adhesive for glass. The area of the bonding portion was 25 mm×25 mm as shown in FIG. 3. Further, the bonding portions were, as shown in FIG. 3, the lower surface of the support glass substrate and a right half of the polycarbonate 30, and the upper surface of the thin plate glass substrate and a left half of the polycarbonate 30.

The polycarbonate 30 bonded to the thin plate glass substrate was fixed with a jig, and the polycarbonate 30 bonded to the support glass substrate was pulled at a pulling rate of 0.5 mm/min in the transverse direction in FIG. 3 (polycarbonate 30 lengthwise direction). The support glass substrate was peeled when a load of 13 kgf (2.1 kgf/cm$^2$) was applied. No fracture or the like occurred on the support glass substrate and the thin plate glass substrate. With respect to the thin plate glass laminate A after firing, the same value as that before firing was obtained.

(5) Measurement of Residual Adhesion Ratio

The residual adhesion ratio of the silicone resin layer in the thin plate glass laminate A was measured by the measurement method disclosed in paragraph No. [0032], whereupon the residual adhesion ratio was 106%.

Example 2

A thin plate glass laminate (thin plate glass laminate B) of the present invention was obtained in the same manner as in Example 1 except that instead of the mixture comprising 100 parts by mass of a solventless addition reaction silicone for release paper (KNS-320A, manufactured by Shin-etsu Silicones) and 2 parts by mass of a platinum catalyst (CAT-PL-56, manufactured by Shin-etsu Silicones), a mixture comprising a linear polyorganosiloxane having vinyl groups at both ends ("8500", manufactured by Arakawa Chemical Industries, Ltd.), a methyl hydrogen polysiloxane having hydrosilyl groups in its molecule ("12031", manufactured by Arakawa Chemical Industries, Ltd.) and a platinum catalyst ("CAT12070", manufactured by Arakawa Chemical Industries, Ltd.) was used. The mixing ratio of the linear polyorganosiloxane and the methyl hydrogen polysiloxane was adjusted so that the molar ratio of the hydrosilyl groups to the vinyl groups became 1.5/1. The platinum catalyst was added in an amount of 5 parts by mass per 100 parts by mass of the total amount of the linear polyorganosiloxane and the methyl hydrogen polysiloxane.

In the thin plate glass laminate B, the thin plate glass substrate was closely bonded to the silicone resin layer without formation of bubbles, was free from convex defects and had favorable smoothness.

The formed thin plate glass laminate B was evaluated as follows.

(1) Simplified Peel Test

In the same manner as in Example 1, the thin plate glass laminate B was disposed so that the thin plate glass substrate faced upward, and the support glass substrate was fixed by means of a jig. In such a state, a part of the peripheral portion of the thin plate glass substrate was peeled from the support glass substrate with a razor, and further, the thin plate glass substrate was manually separated from the support glass substrate, whereupon it was easily peeled.

Further, the thin plate glass laminate B after heat treated at 300° C. for one hour in the air was subjected to the above peel test, whereupon the thin plate glass substrate could be peeled from the support glass substrate without destruction, thus indicating favorable heat resistance.

(2) Peel Test (1) (Before Heating)

Peel test (1) (before heating) was carried out in the same manner as the peel test (1) (before heating) in Example 1 except that the thin plate glass laminate B was used instead of the thin plate glass laminate A. The support glass substrate was peeled when a load of 9 kgf (0.36 kgf/cm$^2$) was applied. No fracture or the like occurred on the support glass substrate and the thin plate glass substrate.

(3) Peel Test (1) (After Heating)

Peel test (1) (after heating) was carried out in the same manner as the peel test (1) (after heating) in Example 1 except that the thin plate glass laminate B was used instead of the thin plate glass laminate A. The support glass substrate was peeled when a load of 15 kgf (0.61 kgf/cm$^2$) was applied. No fracture or the like occurred on the support glass substrate and the thin plate glass substrate.

(4) Shear Strength Test

Shear strength test was carried out in the same manner as the shear strength test in Example 1 except that except that the thin plate glass laminate B was used instead of the thin plate glass laminate A. The support glass substrate was peeled when a load of 9 kgf (1.4 kgf/cm$^2$) was applied. No fracture or the like occurred on the support glass substrate and the thin plate glass substrate. With respect to the thin plate glass laminate B after firing, the same value as that before firing was obtained.

(5) Measurement of Residual Adhesion Ratio

The residual adhesion ratio of the silicone resin layer in the thin plate glass laminate B was measured by the measurement method disclosed in Example 1, whereupon the residual adhesion ratio was 108%.

Example 3

A thin plate glass laminate (thin plate glass laminate C) was obtained in the same manner as in Example 2 except that the mixing ratio of the linear polyorganosiloxane and the methyl hydrogen polysiloxane was adjusted so that the molar ratio of the hydrosilyl groups to the vinyl groups became 1.0/1.

In the thin plate glass laminate C, the thin plate glass substrate was closely bonded to the silicone resin layer without formation of bubbles, was free from convex defects and had favorable smoothness.

The formed thin plate glass laminate C was evaluated as follows.

(1) Simplified Peel Test

The thin plate glass laminate C was disposed so that the thin plate glass substrate faced upward, and the support glass substrate was fixed by means of a jig. In such a state, a part of the peripheral portion of the thin plate glass substrate was peeled from the support glass substrate with a razor, and further, the thin plate glass substrate was manually separated from the support glass substrate, whereupon it was easily peeled.

Further, the thin plate glass laminate C after heat treated at 300° C. for one hour in the air was subjected to the above peel test, whereupon the thin plate glass substrate could be peeled from the support glass substrate without destruction, thus indicating favorable heat resistance.

(2) Peel Test (1) (Before Heating)

Peel test (1) (before heating) was carried out in the same manner as the peel test (1) (before heating) in Example 1 except that the thin plate glass laminate C was used instead of the thin plate glass laminate A. The support glass substrate was peeled when a load of 12 kgf (0.47 kgf/cm$^2$) was applied. No fracture or the like occurred on the support glass substrate and the thin plate glass substrate.

(3) Peel Test (1) (After Heating)

Peel test (1) (after heating) was carried out in the same manner as the peel test (1) (after heating) in Example 1 except that the thin plate glass laminate C was used instead of the thin plate glass laminate A. The support glass substrate was peeled when a load of 12 kgf (0.47 kgf/cm$^2$) was applied. No fracture or the like occurred on the support glass substrate and the thin plate glass substrate.

(4) Shear Strength Test

Shear strength test was carried out in the same manner as the shear strength test in Example 1 except that except that the thin plate glass laminate C was used instead of the thin plate glass laminate A. The support glass substrate was peeled when a load of 12 kgf (1.9 kgf/cm$^2$) was applied. No fracture or the like occurred on the support glass substrate and the thin plate glass substrate. With respect to the thin plate glass laminate C after firing, the same value as that before firing was obtained.

(5) Measurement of Residual Adhesion Ratio

The residual adhesion ratio of the silicone resin layer in the thin plate glass laminate C was measured by the measurement method disclosed in Example 1, whereupon the residual adhesion ratio was 105%.

Example 4

A thin plate glass laminate (thin plate glass laminate D) of the present invention was obtained in the same manner as in Example 1 except that a solvent type addition reaction silicone for release paper (KS-847, manufactured by Shin-etsu Silicones) was used instead of the solventless addition reaction silicone for release paper (KNS-320A, manufactured by Shin-etsu Silicones) and that a platinum catalyst (CAT-PL-50T, manufactured by Shin-etsu Silicones) was used instead of the platinum catalyst (CAT-PL-56, manufactured by Shin-etsu Silicones).

In the thin plate glass laminate D, the thin plate glass substrate was closely bonded to the silicone resin is layer without formation of bubbles, was free from convex defects and had favorable smoothness.

The thin plate glass laminate D was subjected to simplified peel test, whereupon the thin plate glass substrate could easily be separated. Further, the thin plate glass laminate D after heat treated at 300° C. for one hour in the air was also subjected to simplified peel test, whereupon the thin plate glass substrate could easily be peeled, thus indicating favorable heat resistance.

In the same manner as in Example 1, the residual adhesion ratio of the silicone resin layer formed as above was measured, whereupon the residual adhesion ratio was 101%.

Example 5

In this Example, an LCD is produced by using the thin plate glass laminate A obtained in Example 1. Two such thin plate glass laminates A are prepared, and an array forming step is carried out to one laminate to form an array on the surface of the thin plate glass substrate. A color filter forming step is carried out to the other laminate to form a color filter on the surface of the thin plate glass substrate. The thin plate glass substrate on which the array is formed and the thin plate glass substrate on which the color filter is formed are bonded, and a trigger for peeling is made to the edge portion with a razor to separate the support glass substrates. Then, the thin plate glass substrates are cut with a laser cutter to divide them into 28 cells of 51 mm×38 mm, and then a liquid crystal injection step and a step of sealing the inlet are carried out to form liquid crystal cells. A step of bonding a polarizing plate to the formed liquid crystal cells is carried out, and then a module forming step is carried out to obtain an LCD. The LCD thus obtained has no problems in properties.

Example 6

In this Example, an LCD is produced by using the thin plate glass laminate A obtained in Example 1 and an alkali-free glass substrate having a thickness of 0.7 mm. The thin plate glass laminates A is prepared, and a color filter forming step is carried out to form a color filter on the surface of the thin plate glass substrate. Further, an array forming step is applied to an alkali-free glass substrate (AN-100, manufactured by Asahi Glass Company, Limited) having a thickness of 0.7 mm to form an array on the surface of the alkali-free glass substrate having a thickness of 0.7 mm.

The thin plate glass substrate laminate on which the color filter is formed and the alkali-free glass substrate having a thickness of 0.7 mm on which the array is formed are bonded, and a trigger for peeling is made to the edge portion with a razor to separate the support glass substrate from the thin plate glass laminate. Then, the thin plate glass substrate/alkali-free glass substrate bonded product is divided into 28 cells of 51 mm×38 mm. On this occasion, the thin plate glass substrate is cut with a laser cutter. Whereas, the alkali-free glass substrate is cut with a laser cutter or by scribe/break method.

Then, a liquid crystal injection step and a step of sealing the inlet are carried out to form liquid crystal cells. A step of bonding a polarizing plate to the formed liquid crystal cells is carried out, and then a module forming step is carried out to obtain an LCD. The LCD thus obtained has no problems in properties.

Example 7

In this Example, an LCD is produced by using the thin plate glass laminate B obtained in Example 2. Two such thin plate glass laminates B are prepared, and an array forming step is carried out to one laminate to form an array on the surface of the thin plate glass substrate. A color filter forming step is carried out to the other laminate to form a color filter on the surface of the thin plate glass substrate. The thin plate glass substrate on which the array is formed and the thin plate glass substrate on which the color filter is formed are bonded, and a trigger for peeling is made to the edge portion with a razor to separate the support glass substrates. Then, the thin plate glass substrates are cut with a laser cutter to divide them into 28 cells of 51 mm×38 mm, and then a liquid crystal injection step and a step of sealing the inlet are carried out to form liquid crystal cells. A step of bonding a polarizing plate to the formed liquid crystal cells is carried out, and then a module forming step is carried out to obtain an LCD. The LCD thus obtained has no problems in properties.

Example 8

In this Example, an OLED is produced by using the thin plate glass laminate D obtained in Example 4. A step of forming a transparent electrode, a step of forming an auxiliary electrode, a step of evaporating a hole injection layer, a hole transport layer, an electroluminescence layer, an electron transport layer and the like, and a step of sealing them, are carried out to form an organic EL structure on the thin plate glass substrate of the thin plate glass laminate D. Then, the support glass substrate is separated. Then, the thin plate glass substrate is cut with a laser cutter to divide it into 40 cells of 41 mm×30 mm, and the thin plate glass substrate on which the organic EL structure is formed and an opposing substrate are assembled and a module forming step is carried out to prepare an OLED. The OLED thus obtained has no problems in properties.

Comparative Example 1

A thin plate glass laminate E in Comparative Example was obtained in the same manner as in Example 1 except that a silicone resin (SH805, manufactured by Dow Corning Toray Co., Ltd.) was applied to the support glass substrate by a spin coater and heat-cured at 250° C. for one hour to obtain a silicone resin layer having a thickness of 16 μm.

In the thin plate glass laminate E, the silicone resin layer and the support glass substrate were not sufficiently closely bonded, and no laminate could be formed.

Comparative Example 2

A thin plate glass laminate F in Comparative Example was obtained in the same manner as in Example 1 except that a silicone adhesive (YR3340, manufactured by GE Toshiba Silicone) was applied to the support glass substrate by a spin coater and heat-cured at 150° C. for 10 minutes in the air to obtain a silicone resin layer having a thickness of 16 μm.

In the thin plate glass laminate F, the thin plate glass substrate was sufficiently closely bonded to the silicone resin layer and had favorable smoothness, but inclusion of bubbles in the silicone resin layer was observed, and the included bubbles could not be removed.

The thin plate glass laminate F was subjected to simplified peel test, whereupon it was difficult to peel the thin plate glass substrate.

Further, the thin plate glass laminate F was subjected to peel test (1) (before heating), peel test (1) (after heating) and shear strength test in the same manner as in Example 1, whereupon the support glass substrate and the thin plate glass substrate were not peeled, and peeling occurred at the interface between the polycarbonate and the glass substrate. Therefore, the support glass substrate and the thin plate glass substrate could not be separated.

INDUSTRIAL APPLICABILITY

The thin plate glass laminate obtained by the present invention is useful as a glass substrate for various display devices.

The entire disclosure of Japanese Patent Application No. 2005-230434 filed on Aug. 9, 2005 including specification, claims, drawings and summary is incorporated herein by reference in its entirety.

What is claimed is:

1. A thin plate glass laminate, which is formed by laminating a thin plate glass substrate and a support glass substrate,
wherein the thin plate glass substrate and the support glass substrate are laminated by a silicone resin layer having releasability and non-adhesive properties;
wherein the silicone resin layer is a crosslinked product formed by coating the support glass substrate with a linear polyorganosiloxane having vinyl groups at both ends and/or in its side chains, and a methyl hydrogen polysiloxane having hydrosilyl groups in its molecule, followed by heat-curing at a temperature of from 50 to 250° C. for from 5 to 60 minutes in the presence of a platinum catalyst; and
wherein a mixing ratio of the linear polyorganosiloxane and the methyl hydrogen polysiloxane is adjusted so that a molar ratio of the hydrosilyl groups to the vinyl groups is from 1.3/1 to 0.7/1.

2. The thin plate glass laminate according to claim 1, wherein the thickness of the thin plate glass substrate is less than 0.3 mm, and the total thickness of the support glass substrate and the silicone resin layer is at least 0.5 mm.

3. The thin plate glass laminate according to claim 1, wherein a difference between the coefficient of linear expansion of the support glass substrate and the coefficient of linear expansion of the thin plate glass substrate is at most $15 \times 10^{-7}$/° C.

4. The thin plate glass laminate according to claim 1, wherein the surface energy of the silicone resin layer is from 16 to 21 erg/cm$^2$.

5. The thin plate glass laminate according to claim 1, wherein the thin plate glass substrate and the support glass substrate are laminated by a single silicone resin layer.

6. A thin plate glass laminate, which is formed by laminating a thin plate glass substrate and a support glass substrate,
wherein the thin plate glass substrate and the support glass substrate are laminated by a silicone resin layer having releasability and non-adhesive properties;
wherein the silicone resin layer is a cured crosslinked product formed by coating the support glass substrate with a linear polyorganosiloxane having vinyl groups at both ends and/or in its side chains, and a methyl hydrogen polysiloxane having hydrosilyl groups in its molecule, followed by heat-curing at a temperature of from 50 to 250° C. for from 5 to 60 minutes in the presence of a platinum catalyst,
wherein a cohesion failure does not occur when the support glass substrate is separated from the thin plate glass substrate and resealed with another thin plate glass substrate; and
wherein a mixing ratio of the linear polyorganosiloxane and the methyl hydrogen polysiloxane is adjusted so that a molar ratio of the hydrosilyl groups to the vinyl groups is from 1.3/1 to 0.7/1.

7. A thin plate glass laminate, which is formed by laminating a thin plate glass substrate and a support glass substrate,
wherein the thin plate glass substrate and the support glass substrate are laminated by a silicone resin layer having releasability and non-adhesive properties;

wherein the silicone resin layer is a cured crosslinked product formed by coating the support glass substrate with a linear polyorganosiloxane having vinyl groups at both ends and/or in its side chains, and a methyl hydrogen polysiloxane having hydrosilyl groups in its molecule, followed by heat-curing at a temperature of from 50 to 250° C. for from 5 to 60 minutes in the presence of a platinum catalyst, wherein the silicon resin layer has a residual adhesion ratio at least 95%; and wherein a mixing ratio of the linear polyorganosiloxane and the methyl hydrogen polysiloxane is adjusted so that a molar ratio of the hydrosilyl groups to the vinyl groups is from 1.3/1 to 0.7/1.

8. The thin plate glass laminate according to claim 7, wherein the silicon resin layer has a residual adhesion ratio at least 98%.

* * * * *